(12) United States Patent
Vrtis et al.

(10) Patent No.: US 11,164,739 B2
(45) Date of Patent: Nov. 2, 2021

(54) USE OF SILICON STRUCTURE FORMER WITH ORGANIC SUBSTITUTED HARDENING ADDITIVE COMPOUNDS FOR DENSE OSG FILMS

(71) Applicant: Versum Materials US, LLC, Tempe, AZ (US)

(72) Inventors: Raymond Nicholas Vrtis, Tempe, AZ (US); Robert Gordon Ridgeway, Tempe, AZ (US); Jennifer Lynn Anne Achtyl, Tempe, AZ (US); William Robert Entley, Tempe, AZ (US); Dino Sinatore, Tempe, AZ (US); Kathleen Esther Theodorou, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 87 days.

(21) Appl. No.: 16/268,660

(22) Filed: Feb. 6, 2019

(65) Prior Publication Data

US 2019/0244810 A1    Aug. 8, 2019

Related U.S. Application Data

(60) Provisional application No. 62/627,925, filed on Feb. 8, 2018.

(51) Int. Cl.
H01L 21/02 (2006.01)

(52) U.S. Cl.
CPC .. *H01L 21/02118* (2013.01); *H01L 21/02126* (2013.01); *H01L 21/02211* (2013.01); *H01L 21/02216* (2013.01); *H01L 21/02274* (2013.01); *H01L 21/02348* (2013.01)

(58) Field of Classification Search
None
See application file for complete search history.

(56) References Cited

U.S. PATENT DOCUMENTS

| | | | |
|---|---|---|---|
| 2004/0175501 A1* | 9/2004 | Lukas | C23C 16/56 427/255.28 |
| 2013/0260575 A1* | 10/2013 | Al-Rashid | H01L 21/02211 438/789 |

* cited by examiner

*Primary Examiner* — Shamim Ahmed
*Assistant Examiner* — Bradford M Gates
(74) *Attorney, Agent, or Firm* — David K. Benson

(57) ABSTRACT

According to a chemical vapor deposition method for depositing an organosilicate film on a substrate, a gaseous organosilicate composition is introduced into a vacuum chamber. The gaseous organosilicate composition includes a first silicon-containing precursor selected from an organosilane and an organosiloxane, and further includes at least one second silicon-containing precursor selected from compounds represented by the structure of Formula I:

$$R^1_n Si(OR^2)_{4-n} \quad (I),$$

in which $R^1$ is a linear, branched, or cyclic $C_2$-$C_6$ alkyl group; n=1-3; and $R^2$ is a linear, branched, or cyclic $C_1$-$C_6$ alkyl group. A first energy source is applied to the gaseous organosilicate composition in the vacuum chamber to induce reaction of the first silicon-containing precursor and the at least one second silicon-containing precursor and thereby deposit the organosilicate film on at least a portion of the substrate.

17 Claims, 1 Drawing Sheet

Elastic Modulus vs. Dielectric constant for films deposited from mixtures of DEMS and iso-butyltriethoxysilane.

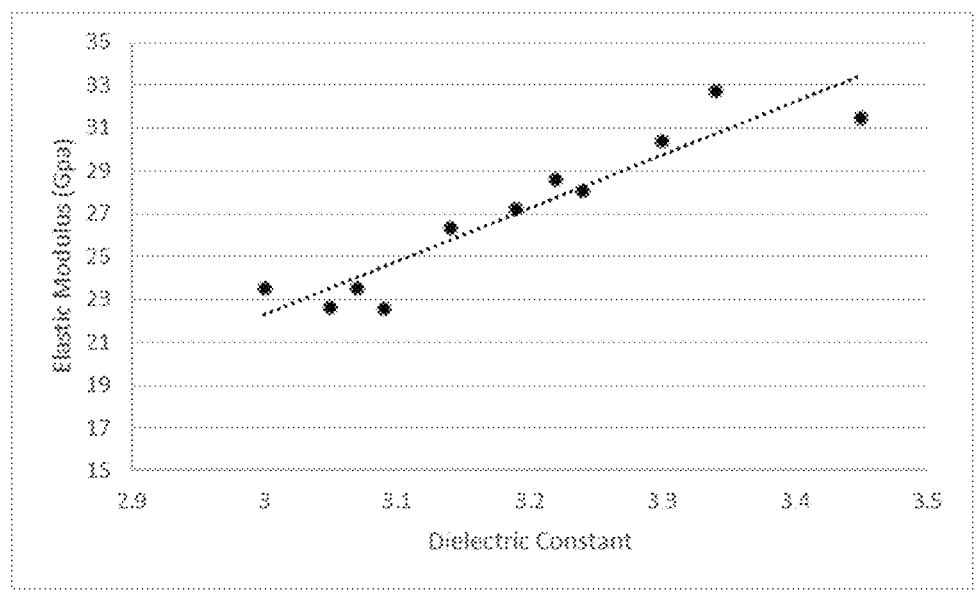
Elastic Modulus vs. Dielectric constant for films deposited from mixtures of DEMS and iso-butyltriethoxysilane.

USE OF SILICON STRUCTURE FORMER WITH ORGANIC SUBSTITUTED HARDENING ADDITIVE COMPOUNDS FOR DENSE OSG FILMS

CROSS REFERENCE TO RELATED PATENT APPLICATIONS

The present patent application claims the benefit of U.S. Provisional Patent Application Ser. No. 62/627,925 filed Feb. 8, 2018 which is hereby incorporated by reference.

BACKGROUND

The present invention relates generally to the formation of dielectric films. More specifically, the invention relates to dielectric materials and films comprising same having a low dielectric constant and enhanced mechanical properties and methods for making same.

All references, including publications, patent applications, and patents, cited herein are hereby incorporated by reference to the same extent as if each reference were individually and specifically indicated to be incorporated by reference and were set forth in its entirety herein.

There is a continuing desire in the microelectronics industry to increase the circuit density in multilevel integrated circuit devices such as memory and logic chips to improve the operating speed and reduce power consumption. In order to continue to reduce the size of devices on integrated circuits, the requirements for preventing capacitive crosstalk between the different levels of metallization becomes increasingly important. These requirements can be summarized by the expression "RC", whereby "R" is the resistance of the conductive line and "C" is the capacitance of the insulating dielectric interlayer. Capacitance "C" is inversely proportional to line spacing and proportional to the dielectric constant (k) of the interlayer dielectric (ILD). Such low dielectric materials are desirable for use, for example, as premetal dielectric layers or interlevel dielectric layers.

A number of processes have been used for preparing low dielectric constant films. Chemical vapor deposition (CVD) and spin-on dielectric (SOD) processes are typically used to prepare thin films of insulating layers. Other hybrid processes are also known such as CVD of liquid polymer precursors and transport polymerization CVD. A wide variety of low k materials deposited by these techniques have been generally classified in categories such as purely inorganic materials, ceramic materials, silica-based materials, purely organic materials, or inorganic-organic hybrids. Likewise, a variety of processes have been used for curing these materials to, for example, decompose and/or remove volatile components and substantially crosslink the films, such as heating, treating the materials with plasmas, electron beams, or UV radiation.

The industry has attempted to produce silica-based materials with lower dielectric constants by incorporating organics or other materials within the silicate lattice. Undoped silica glass ($SiO_2$), referred to herein as "USG," exhibits a dielectric constant of approximately 4.0. However, the dielectric constant of silica glass can be lowered to a value ranging from 2.7 to 3.5 by incorporating terminal groups such as fluorine or methyl into the silicate lattice. These materials are typically deposited as dense films and integrated within the IC device using process steps similar to those for forming USG films.

It is known that silicon dioxide ($SiO_2$) films have an elastic modulus of ~70 GPa but also have a dielectric constant (k) of 3.8-4.2. The dielectric constant (k) of a material generally cannot be reduced without a subsequent reduction in the mechanical properties, i.e., elastic modulus (Young's modulus), hardness, toughness, of the material. Mechanical strength is needed for subsequent processing steps such as etching, CMP ("Chemical Mechanical Planarization"), and depositing additional layers such as diffusion barriers for copper, copper metal ("Cu"), and cap layers on the product. Mechanical integrity, or stiffness, compressive, and shear strengths, may be particularly important to survive CMP. It has been found that the ability to survive CMP may be correlated with the elastic modulus of the material, along with other factors including polishing parameters such as the down force and platen speed. See, for example, Wang et al., "Advanced processing: CMP of CU/low-.kappa. and Cu/ultralow-k layers," Solid State Technology, September, 2001; Lin et al., "Low-k Dielectrics Characterization for Damascene Integration," International Interconnect Technology Conference, Burlingame, Calif., June, 2001. These mechanical properties are also important in the packaging of the final product. Because of the trade-off in mechanical properties, it may be impractical to use certain porous low dielectric compositions.

There are known ways to lower the dielectric constant of a silicon oxide layer while minimizing the impact on mechanical properties. For Example, U.S. Pat. No. 7,932,188 discloses a UV annealing step performed on a porous OSG wherein the film after exposure exhibits at least 10% improvement in its hardness and elastic modulus.

Although it is known that OSG films can be deposited with dielectric constants in the range of 2.8 to 3.3, it has not been possible to deposit these films with an elastic modulus approaching 20 GPa, even after UV annealing. U.S. 2009/0181178 A1 discloses the use of disiloxanes with bridging methylene groups for depositing dense OSG films with dielectric constants in the range of 2.8 to 3.3. The disclosed precursors, however, do not result in the desired mechanical properties. Accordingly, there is a need in the art for a composition of OSG precursor compounds to form a dense OSG film that has a dielectric constant of 2.8 to 3.3 and which has an increased Elastic modulus as measured in gigapascals (GPa).

SUMMARY

The compositions or formulations described herein and methods using same overcome the problems of the prior art by depositing a silicon-containing film on at least a portion of the substrate surface that provides desirable film properties.

In one aspect, the present development provides a process for depositing an organosilicate film on at least a part of a substrate, the process comprising the steps of: providing a substrate within a vacuum chamber; introducing into the vacuum chamber a gaseous organosilicate composition comprising a first silicon-containing precursor selected from the group consisting of an organosilane and an organosiloxane and at least one second silicon-containing precursor selected from the compounds represented by the structure of Formula I:

$$R^1{}_n Si(OR^2)_{4-n} \qquad (I),$$

wherein, $R^1$ is a linear, branched, or cyclic $C_2$-$C_6$ alkyl group; n=1-3; and $R^2$ is a linear, branched, or cyclic $C_1$-$C_6$ alkyl group; and applying energy to the gaseous organosilicate composition in the vacuum chamber to induce reaction of the at least one first and second silicon-containing precursors to deposit a film on at least a portion of the substrate.

In another aspect, there is provided a method of forming a low dielectric constant dense interlayer dielectric film comprising reacting, under chemical vapor deposition conditions sufficient to deposit a film on a substrate, a gaseous organosilicate composition comprising a first silicon-containing precursor selected from the group consisting of an organosilane and an organosiloxane and at least one second silicon-containing precursor selected from the compounds represented by the structure of Formula I:

wherein, $R^1$ is a linear, branched, or cyclic $C_2$-$C_6$ alkyl group; n=1-3; and $R^2$ is a linear, branched, or cyclic $C_1$-$C_6$ alkyl group; optionally, together with one or more additional reactive substance(s), to form an interlayer dielectric film having a dielectric constant of from about 2.5 to about 3.5 and an elastic modulus >20 GPa.

According to another aspect of the invention either of the above methods the gaseous organosilicate does not include the first silicon-containing precursor. In such case the film is formed without reacting the compounds represented by the structure of Formula I with the organosilane and/or organosiloxane.

BRIEF DESCRIPTION OF THE DRAWINGS

The present invention will hereinafter be described in conjunction with the appended figures wherein like numerals denote like elements:

FIG. 1 is a graph of film elastic modulus in Gigapascals (GPa) versus dielectric constant for various films deposited using iso-butyltriethoxysilane alone or in combination with diethoxymethylsilane (DEMS) precursor.

DETAILED DESCRIPTION

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

The present invention is directed to semiconductor thin film process techniques. Methods and system are described for improving quality of the dielectric film morphologically adapted over various device structures.

Accordingly, in one aspect, the present development provides a process for depositing an organosilicate film on at least a part of a substrate, the process comprising the steps of: providing a substrate within a vacuum chamber; introducing into the vacuum chamber a gaseous organosilicate composition comprising a first silicon-containing precursor selected from the group consisting of an organosilane and an organosiloxane and at least one second silicon-containing precursor selected from the compounds represented by the structure of Formula I:

wherein, $R^1$ is a linear, branched, or cyclic $C_2$-$C_6$ alkyl group; n=1-3; and $R^2$ is a linear, branched, or cyclic $C_1$-$C_6$ alkyl group ; and applying energy to the gaseous organosilicate composition in the vacuum chamber to induce reaction of the at least one first and second silicon-containing precursors to deposit a film on at least a portion of the substrate.

The organosilicate film deposited by the method of the present invention is selected from the group consisting of a silicon carbide and a carbon-doped silicon oxide film. The compositions can be pre-mixed compositions, pre-mixtures (mixed before being used in the deposition process), or in-situ mixtures (mixed during the deposition process). Thus, in this disclosure the terms "mixture," "formulation," and "composition" are interchangeable.

In the method of the present development, typically the first step is placing a substrate comprising at least one surface feature into a reactor which is at a temperature of from about −20° C. to about 400° C. Suitable substrates include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("SiO$_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, or diffusion barrier layers, e.g., TiN, Ti(C)N, TaN, Ta(C)N, Ta, W, WN, TiSiN, TaSiN, SiCN, TiSiCN, TaSiCN, or W(C)N.

The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

Examples of suitable deposition processes for the method disclosed herein include, but are not limited to, thermal chemical vapor deposition (CVD), plasma enhanced CVD (PECVD), or plasma enhanced cyclic CVD (PECCVD) process. The term "reactor" as used herein, includes without limitation, a reaction chamber or deposition chamber.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

Although the chemical reagents used herein may be sometimes described as "gaseous," it is understood that the chemical reagents may be delivered directly as a gas to the reactor, delivered as vapors from vaporizing liquid or bubbling liquid using carrier gas such as nitrogen, helium or argon, vapors from subliming solid and/or transported by an inert carrier gas into the reactor.

In preferred embodiments, the organosilicate film deposited by present method is a dense organosilicate glass (OSG) film which has a dielectric constant of from about 2.8 to about 3.3, which has an elastic modulus of greater than 20.0 GPa and, in some embodiments, from about 20 to about 35 gigapascals (GPa) as measured using an MTS nanoindenter. This is a significant improvement in dielectric constant over prior art silicon dioxide films which typically have a dielectric constant of from about 3.8 to about 4.2 with an elastic modulus of about 70 GPa.

The method of the present development includes the step of introducing into the vacuum chamber a gaseous organosilicate composition comprising a first silicon-containing precursor selected from the group consisting of an organosilane and an organosiloxane and at least one second silicon-containing precursor selected from the compounds represented by the structure of Formula I:

$$R^1{}_n Si(OR^2)_{4-n} \qquad (I),$$

wherein, $R^1$ is a linear, branched, or cyclic $C_2$-$C_6$ alkyl group; n=1-3; and $R^2$ is a linear, branched, or cyclic $C_1$-$C_6$ alkyl group; and applying energy to the gaseous organosilicate composition in the vacuum chamber to induce reaction of the at least one first and second silicon-containing precursors to deposit a film on at least a portion of the substrate.

In the formulae above and throughout the description, the term "alkyl" denotes a either a linear or branched functional group having from 2 to 6 carbon atoms. Exemplary linear alkyl groups include, but are not limited to, ethyl, n-propyl, n-butyl, n-pentyl, and n-hexyl groups. Exemplary branched alkyl groups include, but are not limited to, iso-propyl, iso-butyl, sec-butyl, tert-butyl, iso-pentyl, neo-pentyl, tert-pentyl, iso-hexyl, and neo-hexyl. In certain embodiments, the alkyl group may have one or more substituted functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated. The alkyl group may include an ether functionality such as —$CH_2OR$ or —$CH_2CH_2OR$. As used herein, the term "substituted" refers to one or more atoms or group of atoms substituted in place of, for example, a hydrogen atom.

In the formulae above and throughout the description, the term "cyclic alkyl" or "cycloalkyl" means a non-aromatic mono- or multicyclic ring system of about 3 to about 6 carbon atoms, preferably about 5 or 6 carbon atoms. The cycloalkyl is optionally substituted with one or more "ring system substituents" which may be the same or different, and are as defined herein. Representative monocyclic cycloalkyl include cyclopentyl, cyclohexyl, and the like. In such cycloalkyl groups and, preferably in the $C_5$-$C_6$ cycloalkyl groups, one or two of the carbon atoms forming the ring can optionally be replaced with a hetero atom, such as sulfur, oxygen or nitrogen. Examples of such groups are piperidinyl, piperazinyl, morpholinyl, pyrrolidinyl, imidazolidinyl, oxazolidinyl, perhydroazepinyl, perhydrooxazapinyl, oxepanyl, perhydrooxepanyl, tetrahydrofuranyl, and tetrahydropyranyl. $C_3$ and $C_4$ cycloalkyl groups having a member replaced by nitrogen or oxygen include aziridinyl, azetidinyl, oxetanyl, and oxiranyl.

In certain embodiments, any one or more of substituents $R^1$ and $R^2$ in Formula I described above can be linked with a C—C bond to form a ring structure when they are not hydrogen. Further, in these embodiments, the ring structure can also be substituted or unsubstituted.

Examples of compounds of Formula I include iso-butyl-triethoxysilane, isobutyltrimethoxysilane, iso-pentyl-trimethoxysilane, tert-butyltriethoxysilane, 2-isobutyl-2-ethoxy-1,3-oxy-2-silacylcopentane, 1,1-diethoxysilacylcopentane, and 2-isobutyl-2-methyl-1-oxy-silacyclopentane.

The first silicon-containing precursor selected from the group consisting of an organosilane and an organosiloxane can be any organosilane or organosiloxane suitable for use as a silicon-containing precursor in a CVD process. The following are non-limiting examples of such precursors according to the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group.

—$R^1{}_n(OR^2)_{4-n}$ Si where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated, n is 1 to 3.

Example: diethoxymethylsilane, dimethyldimethoxysilane

—$R^1{}_n(OR^2)_{3-n}$Si—O—Si$R^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diethoxydisiloxane

—$R^1_n(OR^2)_{3-n}Si$—$SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraethoxydisilane

—$R^1_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, n is 1 to 3.

Example: dimethyldiacetoxysilane

—$R^1_n(O(O)CR^2)_{3-n}Si$—O—$SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1,3-diacetoxydisiloxane

—$R^1_n(O(O)CR^2)_{3-n}Si$—$SiR^3_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1,1,2,2-tetraacetoxydisilane

—$R^1_n(O(O)CR^2)_{3-n}Si$—O—$SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated, $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,3-dimethyl-1-acetoxy-3-ethoxydisiloxane

—$R^1_n(O(O)CR^2)_{3-n}Si$—$SiR^3_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated and $R^4$ can be independently $C_1$ to $C_6$, linear or branched, saturated, singly or multiply unsaturated, cyclic, aromatic, partially or fully fluorinated, n is 1 to 3 and m is 1 to 3.

Example: 1,2-dimethyl-1-acetoxy-2-ethoxydisilane

—$R^1_n(OR^2)_p(O(O)CR^4)_{4(n+p)}Si$ where $R^1$ can be independently H, $C_1$ to $C_4$, linear or branched, saturated, singly or multiply unsaturated, cyclic, partially or fully fluorinated, $R^2$ can be independently $C_1$ to $C_6$, linear or branched, saturated, singly or multiply unsaturated, cyclic, aromatic, partially or fully fluorinated and $R^4$ can be independently H, $C_1$ to $C_6$, linear or branched, saturated, singly or multiply unsaturated, cyclic, aromatic, partially or fully fluorinated, and n is 1 to 3 and p is 1 to 3.

Example: methylacetoxy-t-butoxysilane

—$R^1_n(OR^2)_p(O(O)CR^4)_{3-n-p}Si$—O—$SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated, $R^4$ and $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,3-dimethyl-1,3-diacetoxy-1,3-diethoxydisiloxane

—$R^1_n(OR^2)_p(O(O)CR^4)_{3-n-p}Si$—$SiR^3_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated, $R^4$, $R^5$ can be independently H, $C_1$ to $C_6$, linear or branched, saturated, singly or multiply unsaturated, cyclic, aromatic, partially or fully fluorinated, n is 1 to 3, m is 1 to 3, p is 1 to 3 and q is 1 to 3.

Example: 1,2-dimethyl-1,2-diacetoxy-1,2-diethoxydisilane

-cyclic siloxanes of the formula $(OSiR_1R_3)_x$, where $R^1$ and $R^3$ can be independently H, $C_1$ to $C_4$, linear or branched, saturated, singly or multiply unsaturated, cyclic, partially or fully fluorinated, and x may be any integer from 2 to 8.

Examples: 1,3,5,7-tetramethylcyclotetrasiloxane, octamethylcyclotetrasiloxane

The following are additional formulas representing certain Si-containing precursors suitable for use according to the present invention:

$R^1_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3 and p is 0 to 3;

$R^1_n(OR^2)_p(O(O)CR^4)_{3-n-p}Si$—O—$SiR^3_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

$R^1{}_n(OR^2)_p(O(O)CR^4)_{3-n-p}Si{-}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3 and m+q≤3;

$R^1{}_n(OR^2)_p(O(O)CR^4)_{3-n-p}Si{-}R^7{-}SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon, $R^4$ and $R^5$ are independently H, $C_1$ to $C_6$ linear or branched, saturated, singly or multiply unsaturated, cyclic, aromatic, partially or fully fluorinated hydrocarbon, n is 0 to 3, m is 0 to 3, q is 0 to 3 and p is 0 to 3, provided that n+m≥1, n+p≤3, and m+q≤3;

$(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3, and t is 2 to 4, provided that n+p≤4;

$(R^1{}_n(OR^2)_p(O(O)CR^3)_{4-(n+p)}Si)_tNH_{3-t}$ where $R^1$ is independently H or $C_1$ to C4 linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon, $R^3$ is independently H, $C_1$ to $C_6$ linear or branched, saturated, singly or multiply unsaturated, cyclic, aromatic, partially or fully fluorinated hydrocarbon, n is 1 to 3, p is 0 to 3 and t is 1 to 3, provided that n+p≤4;

cyclic siloxanes of the formula $(OSiR_1R_3)x$, where $R^1$ and $R^3$ are independently H, $C_1$ to $C_4$, linear or branched, saturated, singly or multiply unsaturated, cyclic, partially or fully fluorinated, and x may be any integer from 2 to 8;

cyclic silazanes of the formula $(NR_1SiR_1R_3)x$, where $R^1$ and $R^3$ are independently H, $C_1$ to $C_4$, linear or branched, saturated, singly or multiply unsaturated, cyclic, partially or fully fluorinated, and x may be any integer from 2 to 8; and cyclic carbosilanes of the formula $(CR_1R_3SiR_1R_3)_x$, where $R^1$ and $R^3$ are independently H, $C_1$ to $C_4$, linear or branched, saturated, singly or multiply unsaturated, cyclic, partially or fully fluorinated, and x may be any integer from 2 to 8.

In preferred embodiments, the composition comprising a first silicon-containing precursor selected from the group consisting of an organosilane and an organosiloxane comprises at least one selected from the group consisting of diethoxymethylsilane, dimethoxymethylsilane, ditertbutoxymethylsilane, methyltriacetatoxysilane, dimethylacetatoxysilane, dimethyldiacetoxysilane dimethyldimethoxysilane, dimethyldiethoxysilane, methyltriethoxysilane, neohexyltriethoxysilane, neopentyltrimethoxysilane, diacetoxymethylsilane, phenyldimethoxysilane, phenyldiethoxysilane, phenyltriethoxysilane, phenyltrimethoxysilane, phenylmethyidimethoxysilane, 1,3,5,7-tetramethyltetracyclosiloxane, octamethyltetracyclosiloxane, 1,1,3,3-tetramethyldisiloxane, 1-neohexyl-1,3,5,7-tetramethylcyclotetrasiloxane, hexamethyldisiloxane, 1,3-dimethyl-1-acetoxy-3-ethoxydislioxane, 1,2-diemthyl-1,2-diacetoxy-1,2-diethoxydisilane, 1,3-dimethyl-1,3-diethoxydisiloxane, 1,3-dimethyl-1,3-diacetoxydisilxane, 1,2-dimethyl,1,1,2,2-tetraacetoxydisilane, 1,2-dimethyl-1,1,2,2-tetraethoxydisilane, 1,3-dimethyl-1-acetoxy-3-ethoxydisiloxane, 1,2-dimethyl-1-acetoxy-2-ethoxy-disilane, methylacetoxy-t-butoxysilane, methylsilane, dimethylsilane, trimethylsilane, tetramethylsilane, hexamethyldisilane, tetramethyldisilane, and dimethyldisilane.

In more preferred embodiments, the composition comprising a first silicon-containing precursor selected from the group consisting of an organosilane and an organosiloxane comprises diethoxymethylsilane (DEMS).

In certain embodiments, mixtures of different organosilicone precursors are used in combination.

The ratio of the silicon-containing precursor of Formula I to the first silicon-containing precursor selected from the group consisting of an organosilane and an organosiloxane may be adjusted for the desired carbon content, dielectric constant, and mechanical properties of the OSG film. Preferably, the ratio of the silicon-containing precursor of Formula I to the first silicon-containing precursor selected from the group consisting of an organosilane and an organosiloxane is from 1:1 to 5:1 and, more preferably from 2:1 to 4:1. The silicon-containing precursor of Formula I and the first silicon-containing precursor selected from the group consisting of an organosilane and an organosiloxane can be delivered to the reaction chamber as a prepared mixture such as, for example, by mixing the precursors prior to use, or alternatively, delivered to the reaction chamber through a plurality of separate lines and mixed within the reaction chamber.

The silicon-containing precursor of Formula I and the first silicon-containing precursor selected from the group consisting of an organosilane and an organosiloxane are also collectively referred to herein as "organosilicon precursor compounds."

The organosilicon precursor compounds described herein may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor compositions may include solvent component(s) of suitable character as may be desirable and advantageous in a given end use application to form a film on a substrate.

The organosilicon precursor compounds are preferably substantially free of halide ions such as chloride or metal ions such as Al. As used herein, the term "substantially free" as it relates to halide ions (or halides) such as, for example, chlorides and fluorides, bromides, iodides, $Al^{3+}$ ions, $Fe^{2+}$, $Fe^{3+}$, $Ni^{2+}$, $Cr^{3+}$ means less than 5 ppm (by weight), preferably less than 3 ppm, and more preferably less than 1 ppm, and most preferably 0 ppm. Chlorides or metal ions are known to act as decomposition catalysts for silicon precursors. Significant levels of chloride in the final product can cause the organosilicon precursors to degrade. The gradual degradation of the organosilicon precursor compounds may directly impact the film deposition process making it difficult for the semiconductor manufacturer to meet film specifications. In addition, the shelf-life or stability is negatively impacted by the higher degradation rate of the organosilicon precursor compounds thereby making it difficult to guarantee a 1-2 year shelf-life. Moreover, organosilicon precursors compounds are known to form flammable and/or pyrophoric gases upon decomposition such as hydrogen and silane. Therefore, the accelerated decomposition of the organosilicon precursor compounds presents safety and performance concerns related to the formation of these flammable and/or pyrophoric gaseous byproducts.

Organosilicon precursor compounds according to the present invention that are substantially free of halides can be achieved by (1) reducing or eliminating chloride sources during chemical synthesis, and/or (2) implementing an effective purification process to remove chloride from the crude product such that the final purified product is substantially free of chlorides. Chloride sources may be reduced during synthesis by using reagents that do not contain halides such as chlorodisilanes, bromodisilanes, or iodisilanes thereby avoiding the production of by-products that contain halide ions. In addition, the aforementioned reagents should be substantially free of chloride impurities such that the resulting crude product is substantially free of chloride impurities. In a similar manner, the synthesis should not use halide based solvents, catalysts, or solvents which contain unacceptably high levels of halide contamination. The crude product may also be treated by various purification methods to render the final product substantially free of halides such as chlorides. Such methods are well described in the prior art and, may include, but are not limited to purification processes such as distillation, or adsorption. Distillation is commonly used to separate impurities from the desire product by exploiting differences in boiling point. Adsorption may also be used to take advantage of the differential adsorptive properties of the components to effect separation such that the final product is substantially free of halide. Adsorbents such as, for example, commercially available $MgO-Al_2O_3$ blends can be used to remove halides such as chloride.

For those embodiments relating to a composition comprising a solvent(s) with the silicon-containing precursor of Formula I and the first silicon-containing precursor selected from the group consisting of an organosilane and an organosiloxane, the solvent or mixture thereof selected does not react with the organosilicon compound. The amount of solvent by weight percentage in the composition ranges from 0.5% by weight to 99.5% or from 10% by weight to 75%. In this or other embodiments, the solvent has a boiling point (b.p.) similar to the b.p. of the organosilicon precursor compounds or the difference between the b.p. of the solvent and the b.p. of the organosilicon precursor compounds is 40° C. or less, 30° C. or less, or 20° C. or less, 10° C. or less, or 5° C. or less. Alternatively, the difference between the boiling points ranges from any one or more of the following end-points: 0, 10, 20, 30, or 40° C. Examples of suitable ranges of b.p. difference include without limitation, 0° C. to 40° C., 20° C. to 30° C., or 10° C. to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-dimethylpiperazine, N,N,N',N'-tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In one particular embodiment, the introducing step, wherein the first silicon-containing precursor selected from the group consisting of an organosilane and an organosiloxane and the at least one second silicon-containing precursor selected from the compounds represented by the structure of Formula I is introduced into the reactor, is conducted at one or more temperatures ranging from −20° C. to 1000° C., or from about 400° C. to about 1000° C., or from about 400° C. to about 600° C., or from about −20° C. to about 400° C. In these or other embodiments, the substrate comprises a semiconductor substrate comprising a surface feature.

An oxidant, such as oxygen ($O_2$), ozone ($O_3$), nitrous oxide ($N_2O$), nitric oxide (NO), nitrogen dioxide ($NO_2$), dinitrogen tetroxide ($N_2O_4$) and/or hydrogen peroxide ($H_2O_2$), can optionally be added, but may not be necessary if the organosilicon precursor contains oxygen and SiO bonds.

In addition to the organosilicon precursors, and optionally the oxygen-providing gas, additional materials can be charged into the vacuum chamber prior to, during and/or after the deposition reaction. Such materials include reactive substances, such as gaseous or liquid organic substances, $NH_3$, $H_2$, $CO_2$, CO, or fluorocarbons. Examples of organic substances are $CH_4$, $C_2H_6$, $C_2H_4$, $C_2H_2$, $C_3H_8$, benzene, naphthalene, toluene and styrene.

The reagents (i.e., organosilicon precursors, oxidant, etc.) can be carried into the reactor separately from distinct sources or as a mixture. The reagents can be delivered to the reactor system by any number of means, preferably using a pressurizable stainless steel vessel fitted with the proper valves and fittings to allow the delivery of liquid to the process reactor.

Energy is applied to the gaseous reagents to induce the gases to react and to form the film on at least a part of the substrate. Such energy can be provided by, e.g., thermal, plasma, pulsed plasma, helicon plasma, high density plasma, inductively coupled plasma, and remote plasma methods. A secondary rf frequency source can be used to modify the plasma characteristics at the substrate surface. Preferably, the film is formed by plasma enhanced chemical vapor deposition. It is particularly preferred to generate a capacitively coupled plasma at a frequency of 13.56 MHz. Plasma power is preferably from 0.02 to 7 watts/cm², more preferably 0.3 to 3 watts/cm², based upon a surface area of the substrate.

It may be advantageous to employ a carrier gas which possesses a low ionization energy to lower the electron temperature in the plasma which in turn will cause less fragmentation in the OSG precursor and porogen. Examples of this type of low ionization gas include $CO_2$, $NH_3$, CO, $CH_4$, Ar, Xe, and Kr.

The flow rate for each of the gaseous reagents preferably ranges from 10 to 5000 sccm, more preferably from 30 to 1000 sccm, per single 200 mm wafer. The actual flow rates needed may depend upon wafer size and chamber configuration, and are in no way limited to 200 mm wafers or single wafer chambers.

Films of the present invention are typically deposited at a rate of at least 50 nm/min and, preferably, at a rate of from 50 to 500 nm/min.

The pressure in the vacuum chamber during deposition is preferably 0.01 to 600 torr, more preferably 1 to 15 torr.

The film is preferably deposited to a thickness of 0.002 to 10 microns, although the thickness can be varied as required. The blanket film deposited on a non-patterned surface has excellent uniformity, with a variation in thickness of less than 2% over 1 standard deviation across the substrate with a reasonable edge exclusion, wherein e.g., a 5 mm outermost edge of the substrate is not included in the statistical calculation of uniformity.

Without intending to be bound by a particular theory, it is suspected that by employing a silicon-containing precursor selected from the compounds represented by the structure of Formula I, it is believed that the precursors of Formula I can facilitate the incorporation of bridging carbon groups between silicon atoms rather than bridging Si—O—Si groups in the deposited film which will decrease the dielectric constant of a pure $SiO_2$ network while retaining the hardness of the Si—O—Si structure as would be found by when replacing Si—O—Si groups with terminal Si—Me groups.

In-situ or post-deposition treatments may be used to enhance materials properties like hardness, stability (to shrinkage, to air exposure, to etching, to wet etching, etc.), integrity, uniformity and adhesion. Such treatments can be applied to the film once it has been deposited. Thus, the term "post-treating" as used herein denotes treating the film with energy (e.g., thermal, plasma, photon, electron, microwave, etc.) or chemicals to enhance materials properties of the deposited film.

The conditions under which post-treating are conducted can vary greatly. For example, post-treating can be conducted under high pressure or under a vacuum ambient.

Thermal annealing is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), etc.). The pressure is preferably about 1 Torr to about 1000 Torr, more preferably atmospheric pressure. However, a vacuum ambient is also possible for thermal annealing as well as any other post-treating means. The temperature is preferably 200-500° C., and the temperature ramp rate is from 0.1 to 100 deg° C./min. The total annealing time is preferably from 0.01 min to 12 hours.

Chemical treatment of the OSG film can also be conducted via use of fluorinating (HF, $SIF_4$, $NF_3$, $F_2$, $COF_2$, $CO_2F_2$, etc.), oxidizing ($H_2O_2$, $O_3$, etc.), chemical drying, methylating, or other chemical treatments that enhance the properties of the final material. Chemicals used in such treatments can be in solid, liquid, gaseous and/or supercritical fluid states.

Supercritical fluid post-treatment is conducted under the following conditions. The fluid can be carbon dioxide, water, nitrous oxide, ethylene, $SF_6$, and/or other types of chemicals. Other chemicals can be added to the supercritical fluid to enhance the process. The chemicals can be inert (e.g., nitrogen, $CO_2$, noble gases (He, Ar, Ne, Kr, Xe), etc.), oxidizing (e.g., oxygen, ozone, nitrous oxide, etc.), or reducing (e.g., dilute or concentrated hydrocarbons, hydrogen, etc.). The temperature is preferably ambient to 500° C. The chemicals can also include larger chemical species such as surfactants. The total exposure time is preferably from 0.01 min to 12 hours.

When the post treatment step is exposure to UV radiation, the temperature of the substrate (and the at least one layer of dielectric material) is preferably from about 25° C. to about 500° C., more preferably from about 25° C. to about 425° C., and still more preferably from about 100° C. to about 400° C. The layer of silicon-containing dielectric material may be exposed to one or more wavelengths within the ultraviolet spectrum or one or more wavelengths within the ultraviolet spectrum such as deep ultraviolet light (i.e., wavelengths of 280 nm or below) or vacuum ultraviolet radiation (i.e., wavelengths of 200 nm or below). The ultraviolet radiation may be dispersive, focused, continuous wave, pulsed, scanning, or shuttered. Sources for the ultraviolet radiation include, but are not limited to, broad band sources (500 to 150 nm), dual frequency sources, e.g., combination of two monochromatic sources, an excimer laser, $CO_2$ laser, a barrier discharge lamp, a mercury lamp, a microwave-generated UV lamp, a laser such as a frequency doubled or frequency tripled laser in the IR or visible region, or a two-photon absorption from a laser in the visible region.

In certain embodiments, the ultraviolet radiation source is passed through optics to control the environment to which the sample is exposed. By controlling the environment in the chamber, the temperature of the substrate can be kept relatively low during the exposing step by adjusting the ultraviolet light to a particular wavelength.

Plasma treating for selective removal of labile groups and possible chemical modification of the OSG film is conducted under the following conditions. The environment can be inert (nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrogen, hydrocarbons (saturated, unsaturated, linear or branched, aromatics), etc.). The plasma power is preferably 0-5000 W. The temperature is preferably ambient to 500° C. The pressure is preferably 10 mtorr to atmospheric pressure. The total curing time is preferably 0.01 min to 12 hours.

The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power is preferably 0 to 5000 W. The wavelength is preferably IR, visible, UV or deep UV (wavelengths <200 nm). The total curing time is preferably 0.01 min to 12 hours.

Microwave post treatment is conducted under the following conditions. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The power and wavelengths are varied and tunable to specific bonds. The total curing time is preferably from 0.01 min to 12 hours.

Electron beam post treatment is conducted under the following conditions. The environment can be vacuum, inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.), or reducing (e.g., dilute or concentrated hydrocarbons, hydrogen, etc.). The temperature is preferably ambient to 500° C. The electron density and energy can be varied and tunable to specific bonds. The total curing time is preferably from 0.001 min to 12 hours, and may be continuous or pulsed. Additional guidance regarding the general use of electron beams is available in publications such as: S. Chattopadhyay et al., Journal of Materials Science, 36 (2001) 4323-4330; G. Kloster et al., Proceedings of IITC, Jun. 3-5, 2002, SF, CA; and U.S. Pat. Nos. 6,207,555 B1, 6,204,201 B1 and 6,132,814 A1. The use of electron beam treatment may provide for porogen removal and enhancement of film mechanical properties through bond-formation processes in matrix.

In preferred embodiments, the post-treatment step is conducted in a non-oxidizing atmosphere such as an inert atmosphere (e.g., nitrogen, helium, argon, etc.), a reducing atmosphere (e.g., $H_2$, CO), or vacuum. Specific temperature and time durations for the exposure step may vary depending upon the chemical species used to restore the film's dielectric constant. The exposure step can be conducted for a time of about 60 minutes or less, preferably about 10 minutes or less, and more preferably for about 1 minute or less. The exposing step can occur in the same vessel/apparatus as the contacting step or a different vessel.

The films deposited by the method of the present invention have improved hardness versus their dielectric constants. Preferably, the films of the present invention have a dielectric constant of between 2.5 and 3.5, preferably, from 2.8 and 3.3, and an elastic modulus of >20.0 GPa such as, for example, from about 20 to about 35 GPa as measured by an MTS nanoindenter. Films deposited according to the present invention have a density of >2.0 g/cc.

In one embodiment, the film of the present invention has a dielectric constant of 2.5 to 3.5 and a Young's modulus greater than 20 GPa and/or a nanoindentation hardness greater than 3.5 GPa.

The present invention can be practiced using equipment known in the art. For example, the inventive method can use a reactor that is conventional in the semiconductor manufacturing art.

The invention will be illustrated in more detail with reference to the following Examples, but it should be understood that the present invention is not deemed to be limited thereto.

EXAMPLES

Dense OSG Deposition from OSG Precursors—General Procedures

Exemplary films were formed via a plasma enhanced CVD process using an Applied Materials Precision-5000 system in a 200 mm DxZ vacuum chamber that was fitted with an Advance Energy 200 rf generator from a variety of different chemical precursors and process conditions. The CVD process generally involved the following basic steps: initial set-up and stabilization of gas flows, deposition, and purge/evacuation of chamber prior to wafer removal. UV annealing was performed using a Fusion UV system with a broad band UV bulb, with the wafer held under a helium gas flow at <10 torr pressure and at a temperature <400° C.

Thickness and refractive index were measured on an SCI Filmtek 2000 Reflectometer. Dielectric constants were determined using Hg probe technique on mid-resistivity p-type wafers (range 8-12 ohm-cm). FTIR spectra were measured using a Nicholet Nexxus 470 FTIR spectrometer. Mechanical properties were determined using MTS Nano Indenter. Compositional data were obtained by x-ray photoelectron spectroscopy (XPS) on a Physical Electronics 5000LS. The atomic% values reported in the tables do not include hydrogen.

Comparative Example 1

Deposition of Dense OSG Films from DEMS

An organosilicate (OSG) layer was deposited using DEMS was accomplished using the following recipe: 1200 mg/min DEMS which was delivered to the chamber via DLI, 200 sccm helium carrier gas flow, 10 sccm $O_2$ gas flow, 350 milli-inch showerhead/wafer spacing 350° C. wafer chuck temperature, 7 Torr chamber pressure to which a 550 W plasma was applied. The resulting film was then UV annealed for 4 minutes at 400 C to mechanically enhance the film. The resulting film had the following properties: dielectric constant at 1 MHz was 3.06, Modulus 19.83 GPa, Hardness 3.64 GPa.

Example 1

Deposition of Dense OSG Films from a Mixture of DEMS and iBTEOS

An OSG film was deposited using the following recipe: 1200 mg/min iso-butyltriethoxysilane (iBTEOS) and 600 mg/min of Diethoxymethylsilane (DEMS) was delivered to the chamber via DLI, 200 sccm helium carrier gas flow, 30 sccm $O_2$ flow, 350 milli-inch showerhead/wafer spacing 350° C. wafer chuck temperature, 7 Torr chamber pressure to which a 650 W plasma was applied. The resulting dense OSG film was then UV annealed for 4 minutes to mechanically enhance the film. The resulting film had the following properties: dielectric constant at 1 MHz was 3.07, elastic modulus 23.53 GPa, hardness 3.67 GPa, refractive index at 632 nm of 1.415, elemental composition as measured by XPS of 10.1% C, 55.3% O, and 34.6% Si.

Example 2

Deposition of Dense OSG Films from a Mixture of DEMS and iBTEOS at Higher iBTEOS ratios An OSG film was deposited using the following recipe: 1200 mg/min iso-butyltriethoxysilane (iBTEOS) and 300 mg/min of Diethoxymethylsilane (DEMS) was delivered to the chamber via DLI, 200 sccm He carrier gas flow, 30 sccm $O_2$ flow, 350 milli-inch showerhead/wafer spacing 350° C. wafer chuck temperature, 7 Torr chamber pressure to which a 650 W plasma was applied. The resulting dense OSG film was then UV annealed for 4 minutes to mechanically enhance the film. The resulting film had the following properties: dielectric constant at 1 MHz was 3.14, elastic modulus 26.3 GPa, hardness 4.0 GPa, refractive index at 632 nm of 1.419, elemental composition as measured by XPS of 8.6% C, 56.6% O, and 34.8% Si.

Example 3

Deposition of Dense OSG Films from iBTEOS

An OSG film was deposited using the following recipe: 1200 mg/min iso-butyltriethoxysilane (iBTEOS) was delivered to the chamber via DLI, 200 sccm helium carrier gas flow, 30 sccm $O_2$ flow, 350 milli-inch showerhead/wafer spacing 350° C. wafer chuck temperature, 7 Torr chamber pressure to which a 650 W plasma was applied. The resulting dense OSG film was then UV annealed for 4 minutes to mechanically enhance the film. The resulting film had the following properties: dielectric constant at 1 MHz was 3.30, elastic modulus 30.4 GPa, hardness 4.3 GPa, refractive index at 632 nm of 1.414, elemental composition as measured by XPS of 7.0% C, 57.0% O, and 36.0% Si.

By varying the deposition conditions and silicate precursor flow ratios it was possible to achieve a range of properties as shown in Table 1 below.

TABLE 1

| Dielectric | Modulus (GPa) | Hardness (GPa) | % C | % O | % Si |
| --- | --- | --- | --- | --- | --- |
| 3.30 | 30.4 | 4.3 | 7.0 | 57.0 | 36.0 |
| 3.45 | 31.5 | 4.3 | 5.4 | 59.1 | 35.5 |
| 3.14 | 26.3 | 4.0 | 8.7 | 56.5 | 34.8 |
| 3.19 | 27.2 | 4.0 | 6.5 | 59.0 | 34.5 |
| 3.05 | 22.6 | 3.4 | 8.8 | 55.7 | 35.5 |
| 3.09 | 22.6 | 3.3 | 6.2 | 59.0 | 34.8 |
| 3.24 | 28.1 | 4.2 | 8.1 | 56.5 | 35.4 |
| 3.22 | 28.6 | 4.2 | 8.1 | 57.5 | 34.4 |
| 3.07 | 23.5 | 3.7 | 10.1 | 55.3 | 34.6 |
| 3.00 | 23.5 | 3.6 | 7.6 | 56.6 | 35.8 |
| 3.34 | 32.7 | 4.7 | 5.7 | 58.7 | 35.6 |

FIG. 1 is a graph of film elastic modulus in Gigapascals (GPa) versus dielectric constant comparing the results of the film deposited with iso-butyltriethoxysilane (iBTEOS) alone or in combination with diethoxymethylsilane (DEMS) precursor.

Although the principles of the invention have been described above in connection with preferred embodiments, it is to be clearly understood that this description is made only by way of example and not as a limitation of the scope of the invention.

The invention claimed is:

1. A chemical vapor deposition method for depositing an organosilicate film on a substrate, the process comprising the steps of:
   providing the substrate within a vacuum chamber;
   introducing into the vacuum chamber a gaseous organosilicate composition comprising a first silicon-containing precursor selected from the group consisting of an organosilane and an organosiloxane and at least one second silicon-containing precursor selected from compounds represented by the structure of Formula I:

$R^1{}_n Si(OR^2)_{4-n}$ (I), 

wherein, $R^1$ is a linear $C_2$-$C_6$ alkyl group, or a branched, or cyclic $C_3$-$C_6$ alkyl group; n=1-3; and $R^2$ is a linear $C_1$-$C_6$ alkyl group, or a branched, or cyclic $C_3$-$C_6$ alkyl group;
   applying a first energy source to the gaseous organosilicate composition in the vacuum chamber to induce reaction of the first silicon-containing precursor and the at least one second silicon-containing precursor and thereby deposit the organosilicate film on at least a portion of the substrate, and
   introducing into the vacuum chamber an oxidant selected from the group consisting of $O_2$, $O_3$, $H_2O_2$, $N_2O$, and mixtures thereof prior to and/or during the step of applying the first energy source,
   wherein the organosilicate film has a dielectric constant of between 2.8 and 3.3 and an elastic modulus greater than about 20.0 GPa.

2. The method of claim 1, further comprising performing a post-treatment to the organosilicate film, the post-treatment comprising exposing the organosilicate film to one or more of an energy source and a chemical.

3. The method of claim 2, wherein the step of performing a post-treatment comprises exposing the organosilicate film to UV radiation.

4. The method of claim 1, wherein the elastic modulus is between about 20.0 and about 35.0 GPa.

5. The method of claim 1, wherein the first energy source is plasma energy.

6. The method of claim 1, wherein the substrate is a silicon wafer.

7. The method of claim 1, wherein the first silicon-containing precursor is selected from the group consisting of diethoxymethylsilane, 1,3,5,7-tetramethyltetracyclosiloxane, and octamethyltetracyclosiloxane.

8. The method of claim 7, wherein the first silicon-containing precursor is diethoxymethylsilane.

9. The method of claim 8, wherein the at least one second silicon-containing precursor comprises iso-butyltriethoxysilane.

10. The method of claim 1, wherein the chemical vapor deposition excludes the use of an oxidant.

11. The method of claim 1, further comprising introducing into the vacuum chamber one or more inert gases selected from the group consisting of helium, neon, argon, krypton, xenon, and nitrogen.

12. The method of claim 1, wherein the organosilicate film has a density of >2.0 g/cc.

13. A chemical vapor deposition method for depositing an organosilicate film on a substrate, the process comprising the steps of:
   providing the substrate within a vacuum chamber;
   introducing into the vacuum chamber a gaseous organosilicate composition comprising at least one silicon-containing precursor selected from compounds represented by the structure of Formula I:

$R^1{}_n Si(OR^2)_{4-n}$ (I), 

wherein, $R^1$ is a linear $C_2$-$C_6$ alkyl group, or a branched, or cyclic $C_3$-$C_6$ alkyl group; n =1-3; and $R^2$ is a linear $C_1$-$C_6$ alkyl group, or a branched, or cyclic $C_3$-$C_6$ alkyl group;
   applying a first energy source to the gaseous organosilicate composition in the vacuum chamber to thereby deposit the organosilicate film on at least a portion of the substrate, and
   introducing into the vacuum chamber an oxidant selected from the group consisting of $O_2$, $O_3$, $H_2O_2$, $N_2O$, and mixtures thereof prior to and/or during the step of applying the first energy source,
   wherein the organosilicate film has a dielectric constant of between 2.8 and 3.3 and an elastic modulus greater than about 20.0 GPa.

14. The method of claim 13, further comprising performing a post-treatment to the organosilicate film, the post-treatment comprising exposing the organosilicate film to one or more of an energy source and a chemical.

15. The method of claim 13, further comprising exposing the organosilicate film to UV radiation.

16. The method of claim 13, wherein the first energy source is plasma energy.

17. The method of claim 13, wherein the gaseous organosilicate composition further comprises diethoxymethylsilane.

* * * * *